United States Patent [19]

Sagami et al.

[11] Patent Number: 4,703,338
[45] Date of Patent: Oct. 27, 1987

[54] RESIN COMPOSITION TO SEAL ELECTRONIC DEVICE

[75] Inventors: Yosuke Sagami, Yokohama; Akira Yamamoto, Yachiyo; Shoji Watanabe, Otake; Tomohisa Isobe, Iwakuni; Susumu Funato, Otake, all of Japan

[73] Assignee: Daicel Chemical Industries, Ltd., Osaka, Japan

[21] Appl. No.: 873,113

[22] Filed: Jun. 10, 1986

Related U.S. Application Data

[62] Division of Ser. No. 659,997, Oct. 12, 1984, abandoned.

[30] Foreign Application Priority Data

Oct. 14, 1983 [JP] Japan ................... 58-192169
Mar. 22, 1984 [JP] Japan ................... 59-55109
Jun. 12, 1984 [JP] Japan ................... 59-119220

[51] Int. Cl.$^4$ ............................. H01L 23/28
[52] U.S. Cl. ........................... 357/72; 522/103; 525/922
[58] Field of Search ............. 525/922; 522/103; 357/72

[56] References Cited

U.S. PATENT DOCUMENTS

| | | | |
|---|---|---|---|
| 3,524,903 | 8/1970 | Nargis | 525/922 |
| 3,535,403 | 10/1970 | Holub | 525/922 |
| 3,574,794 | 4/1971 | Nargis | 525/922 |
| 3,586,526 | 8/1971 | Aronoff | 525/922 |
| 3,586,527 | 6/1971 | Aronoff | 525/922 |
| 3,674,545 | 7/1975 | Strolle | 525/922 |
| 3,980,483 | 9/1976 | Nishikubo | 525/922 |
| 4,156,035 | 5/1979 | Tsao | 522/103 |
| 4,221,892 | 9/1980 | Baron | 525/922 |
| 4,428,807 | 1/1984 | Lee | 204/159.14 |
| 4,525,258 | 6/1985 | Watanabe | 322/103 |

FOREIGN PATENT DOCUMENTS

| | | | |
|---|---|---|---|
| 0082603 | 6/1983 | European Pat. Off. | 522/103 |
| 52-52987 | 10/1977 | Japan . | |
| 54-10400 | 1/1979 | Japan . | |
| 54-91595 | 7/1979 | Japan . | |
| 57-117519 | 7/1982 | Japan | 522/103 |

Primary Examiner—C. Warren Ivy
Attorney, Agent, or Firm—Flynn, Thiel, Boutell & Tanis

[57] ABSTRACT

A resin composition is suitable to seal an electronic device, when cured, and comprises:
(a) an unsaturated alicyclic epoxy ester compound obtained by reacting an alicyclic epoxy compound having at least two epoxy groups in the molecule with 0.5 to 1.1 equivalent, per equivalent of the epoxy group, of acrylic or methacrylic acid,
(b) a polymerizable vinyl monomer, and
(c) a photopolymerization initiator.

18 Claims, No Drawings

RESIN COMPOSITION TO SEAL ELECTRONIC DEVICE

This application is a division of U.S. Ser. No. 659,997, filed Oct. 12, 1984, now abandoned.

The present invention relates to an electronic device sealed with a curable resin composition having excellent heat resistance and insulating properties.

Electronic parts such as IC, transistors, diodes, coils, capacitors, resistors, connectors and LSI have been sealed generally with a synthetic resin for the purpose of maintaining their electrical insulating properties, mechanically protecting them and preventing changes of their characteristics by the external atmosphere.

As the synthetic resins, thermosetting resins such as epoxy resin have been used mainly. The epoxy resin contains a polyamine, acid anhydride, phenolic resin or dicyandiamide as a hardening agent and, if necessary, a hardening accelerator such as a tertiary amine or imidazole.

As compared with a hermetic sealing process wherein metals or ceramics are used, this sealing process with the epoxy resin composition is more advantageous because of the following merits:

(1) low cost, and
(2) possibility of mass production.

However, this process has the following demerits with respect to the reliability:

(1) the reliability under moist conditions is insufficient, judging from a high reliability required of the resin-sealed electronic devices, (2) electric characteristics of the resin-sealed electronic devices at a high temperature are insufficient, judging from a high reliability required of them, and (3) their hardening characteristics, particularly latent curability, are insufficient.

Reasons for the insufficient reliability under moist conditions are considered to be as follows: the hardened epoxy resin composition used for the sealing has a hygroscopicity and water vapor permeability and, therefore, external water penetrates through the hardened resin seal to reach the surface of the sealed electronic device at a high temperature in a high moisture atmosphere. Further, the sealing resin contains impurities formed in the epoxy resin production process, hydrolyzable chlorine and trace amounts of ionic impurities contained in the starting materials. It is substantially impossible to remove them completely.

By the mutual action of water and the ionic impurities, the functions of the resin-sealed electronic device are deteriorated. Namely, insulating properties are reduced and leakage current is increased. Further, aluminum electrodes and wires contained in the electronic devices are corroded to deteriorate the characteristics thereof and, in an extreme case, to snap the wires. Thus, the impurities have been a serious cause for the reliability reduction of the resin-sealed electronic devices.

The mechanism of the reduction of the electric characteristics of the resin-sealed electronic devices at a high temperature is considered to be as follows: trace amounts of the ionic impurities and polar substances contained in the sealing resin become mobile as the thermal movement is accelerated at a high temperature and, consequently, the electric characteristics of the sealing resin are reduced. The sealing resin closely adheres to the surface of the electronic device, so that when an electric field is realized in the electronic device, the mobilities of the ionic impurities and polar substances in the sealing resin closely adhering thereto are further promoted by the effects of the electric field to seriously deteriorate the electric characteristics locally. The deterioration thus caused exerts an influence on the characteristics of the electronic device to invite the deterioration of the electric characteristics, mainly leakage, of the resin-sealed electronic devices, such as an increase in leakage current at a high temperature.

Latent curability is required of the epoxy resin composition as described above. In using the epoxy resin composition for the sealing, generally the epoxy resin is mixed beforehand with a hardening agent and a curing accelerator to form the epoxy resin composition, which is stored and used for sealing of the electronic devices when needed. Therefore, it is necessary for the composition that it can be stored for a long time without occurrence of the hardening reaction and rapidly hardened when needed.

Conventional epoxy resin compositions have unsatisfactory latent curability in that the difference between the hardening reaction rate at a high temperature at the time of use and that at a low temperature during the storage is insufficient so that the hardening reaction proceeds at a considerable rate even during storage. Thus, they should be kept in a refrigerator with scrupulous care immediately before the use. Thus, the handling of the conventional compositions has been troublesome.

The above-mentioned defects have become highlighted particularly in case of using a powdered or solid epoxy resin containing novolak epoxy resin and a phenolic resin hardening agent and used for sealing a transfer mold, which resin is used recently as a sealing agent for VLSI, especially when the degree of integration of LSI is high.

A sealing or insulating coating of an electronic part such as a capacitor or resistor is effected mainly by coating the same with a powdered paint obtained by pulverizing a resin composition comprising a solid epoxy resin and a solid hardening agent by a fluidization dip method and then hardening the composition by heating.

However, this conventional process has problems that the hardened product has a high cure shrinkage strain to damage enclosed semiconductor elements. Under these circumstances, a flexibilizer is added to the composition to prevent the shrinkage strain. In this process, however, the heat distortion temperature of the hardened product is lowered seriously and its hardness is also reduced. Another problem is that bubbles are formed within the hardened product.

A quite long time is required for hardening the epoxy composition, since it is hardened by heating. Further, a two-stage hardening system is generally required of the composition, since the rapid hardening by heating poses problems such as heat generation and cure shrinkage strain. The two-stage hardening system comprises a pre-hardening step in which the gelation is effected at a relatively low temperature and a post-hardening step in which the hardening is further effected at a relatively high temperature. In this system, an extremely high thermal energy is necessitated.

An object of the present invention is to provide a resin-sealed electronic device having a high reliability which is sealed with a resin composition free of the defects of the conventional epoxy resin compositions and having excellent moisture resistance, high-temperature electric characteristics, durability and latent curability, which composition can be hardened within a short time, by overcoming the defects of the conventional epoxy resin composition.

After intensive invetigations made for the purpose of attaining the above-mentioned object, the inventors have found that a specified, curable resin composition has excellent moisture resistance and high-temperature electric characteristics, high hardness, high thermal deformation temperature and excellent latent curability. By using the resin composition as a sealing resin for resin-sealed electronic devices, resin-sealed electronic devices having excellent moisture resistance and high-temperature electric properties and a high reliability can be obtained.

The present invention relates to a resin-sealed electronic device characterized in that it is sealed with a hardened composition containing as indispensable components:

(a) an unsaturated alicyclic epoxy ester compound obtained by reacting an alicyclic epoxy compound having at least two epoxy groups in the molecule with 0.5 to 1.1 equivalents, per equivalent of the epoxy group, of acrylic or methacrylic acid, (b) a polymerizable vinyl monomer, and (c) a photopolymerization initiator.

The present invention will now be illustrated in detail.

The alicyclic epoxy compounds having at least two epoxy groups in the molecule for use in the preparation of the unsaturated alicyclic epoxy esters (a) according to the present invention include, for example, the following compounds:

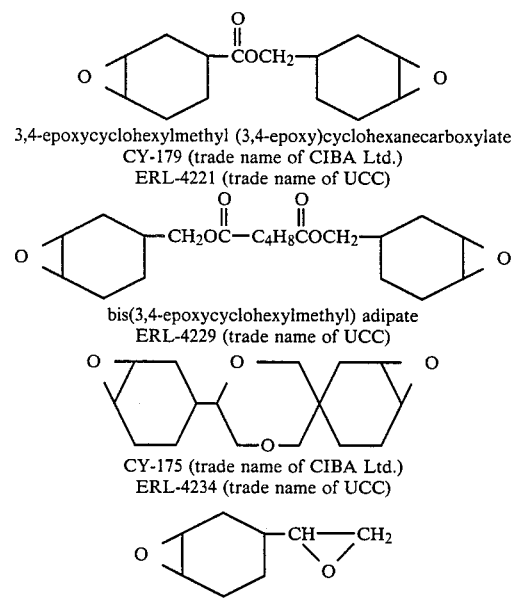

-continued
vinylcyclohexene dioxide
ERL-4206 (trade name of UCC)

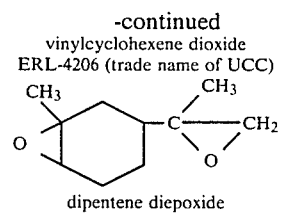

dipentene diepoxide

The unsaturated alicyclic epoxy esters are prepared by reacting the alicyclic epoxy compound with 0.5 to 1.1 equivalents, per equivalent of the epoxy group, of acrylic or methacrylic acid.

In this reaction, a catalyst for the ring-opening reaction of the epoxy group with the carboxylic acid may be used. Preferred catalyst include, for example, tertiary amines such as triethylamine, tripropylamine, tributylamine and benzyldimethylamine; quaternary ammonium salts of tertiary amines such as tetramethylammonium chloride, tetramethylammonium bromide, benzyltrimethylammonium chloride and benzyltriethylammonium bromide; and imidazoles such as 2-ethylimidazole and 2-methylimidazole. The catalyst is used in an amount of 0.05 to 3.0 wt. %, preferably 0.1 to 0.5 wt. %, based on the reactants.

It is preferred to add a polymerization inhibitor to the reaction system to prevent the occurrence of the polymerization in the course of the reaction. The amount of the polymerization inhibitor is 0.02 to 3.0 wt. %, preferably 0.05 to 1.0 wt. %.

The polymerization inhibitors include, for example, hydroquinone, hydroquinone monomethyl ether, benzoquinone, 2,5-diphenyl-p-benzoquinone, catechol, β-naphthol, mono-tert-butylhydroquinone and phenothiazine.

The reaction is carried out at 50° to 130° C., preferably 60° to 120° C. It is preferred to blow air into the reaction system to prevent the polymerization during the reaction.

The reaction may be carried out in a suitable solvent. The solvents include, for example, toluene, benzene, methyl ethyl ketone and methyl isobutyl ketone. The polymerizable vinyl monomer per se may be used as the reaction solvent.

The obtained unsaturated alicyclic epoxy ester, i.e. an indispensable component of the present invention, contains photopolymerizable or radical-heat-polymerizable unsaturated acrylic or methacrylic group in the molecule. When 3,4-epoxycyclohexylmethyl (3,4-epoxy)cyclohexanecarboxylate is used as the alicyclic epoxy compound, the unsaturated alicyclic epoxy ester obtained by the reaction thereof with acrylic or methacrylic acid mainly has chemical structures (I) and (II):

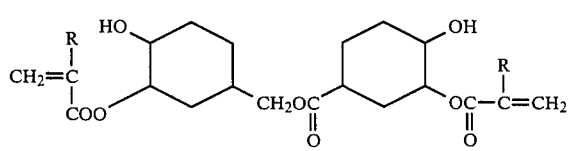

-continued

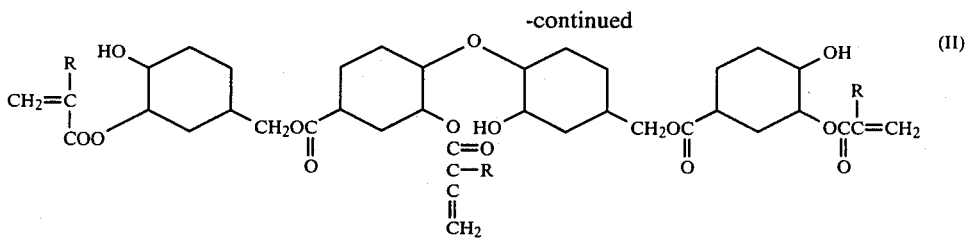

wherein R represents H or CH$_3$.

The above formulae (I) and (II) show structures formed by ring-opening of the epoxy groups of the alicyclic diepoxide with acrylic or methacrylic acid.

In addition to the ring-opening reaction with acrylic or methacrylic acid, that of the epoxy group with a hydroxyl group formed by the ring-opening reaction of the carboxyl group and epoxy group proceeds simultaneously. Therefore, a dimer or trimer as shown by formula (II) is also contained in the product.

The higher the content of the compound of formula (I), the lower the viscosity of the product. The higher the content of the dimer of formula (II) and polymers, the higher the viscosity of the product.

The above content can be controlled easily by varying the equivalent ratio of the epoxy group to the carboxyl group to be reacted. As the epoxy group to the carboxyl group equivalent ratio is increased, the excessive epoxy group reacts with the hydroxyl group to form an oligomer and to increase the viscosity.

The polymerizable vinyl monomer as one of the indispensable components in the present invention is any radical-polymerizable compound such as conventional acrylic ester, methacrylic ester, diaryl ester, styrene or substituted styrene. In addition to these monofunctional monomers, polyfunctional monomers having at least two polymerizable vinyl groups in the molecule may also be used. They may be used either alone or in the form of a mixture of two or more of them.

The monofunctional polymerizable vinyl monomers include, for example, acrylic esters such as methyl acrylate, ethyl acrylate, propyl acrylate, n-butyl acrylate, isobutyl acrylate, t-butyl acrylate, amyl acrylate, n-hexyl acrylate, 2-ethylhexyl acrylate, cyclohexyl acrylate, octyl acrylate, nonyl acrylate, dodecyl acrylate, β-hydroxyethyl acrylate, β-hydroxypropyl acrylate, glycerol monoacrylate, polycaprolactonediol monoacrylate, glycidyl acrylate, dimethylaminoethyl acrylate, phenoxyethyl acrylate, cellosolve acrylate, allyl acrylate, benzyl acrylate, isobornyl acrylate, tetrahydrofurfuryl acrylate and allyloxyethyl phosphate; as well as corresponding methacrylates. Further, there may also be used styrene, vinyltoluene, α-methylstyrene, N-vinylpyrrolidone, acrylonitrile and vinyl acetate.

The difunctional or polyfunctional, polymerizable vinyl monomers include, for example, ethylene glycol diacrylate, diethylene glycol diacrylate, triethylene glycol diacrylate, 1,4-butylene glycol diacrylate, neopentyl glycol diacrylate, neopentyl glycol adipate diacrylate, neopentyl glycol hydroxypivalate diacrylate, trimethylolpropane triacrylate, pentaerythritol triacrylate, dipentaerythritol hexaacrylate, various polyester acrylates, epoxy acrylate, urethane acrylate and novolak acrylate; as well as corresponding methacrylates.

The weight ratio of (a)/(b) in the composition of the present invention is 40/60 to 95/5, preferably 50/50 to 90/10. When this ratio is less than 40/60, no high thermal deformation temperature of the hardened product can be obtained. When said ratio exceeds 95/5, the resulting composition has an extremely high viscosity and its workability during the operation is poor.

As the photopolymerization initiator as the indispensable component in the present invention, any ordinary one which is excited by irradiation with U.V. rays to form a radical may be used. The photopolymerization initiators include, for example, benzoin, benzoin methyl ether, benzoin ethyl ether, benzoin n-propyl ether, benzoin isopropyl ether, benzoin n-butyl ether, benzophenone, p-methylbenzophenone, Michler's ketone, acetophenone, 2-chlorodioxanthone, anthraquinone, 2-methylanthraquinone, phenyl disulfide and 2-nitrofluorene. These initiators may be used alone or in the form of a mixture of two or more of them. They are used in an amount of 0.1 to 10 wt. % based on the total amount of the above components (a) and (b).

A photosensitizer may be used in combination with the photopolymerization initiator to accelerate the photopolymerization reaction. The photosensitizers include, for example, tertiary amines such as p-methyl-N,N-dimethylaniline, triethylamine, triethanolamine and 2-dimethylaminoethanol; alkylphosphines such as triphenylphosphine; and thio ethers such as β-thiodiglycol. These photosensitizers may be used either alone or in the form of a mixture of two or more of them. They are used preferably in an amount of 0.1 to 10 wt. % based on the total amount of the above components (a) and (b).

The photopolymerization initiator is necessary for hardening the composition of the present invention. The hardening can be effected rapidly at room temperature by irradiation with U.V. rays. It is preferred to continue the hardening by heating after the hardening by U.V. rays. For this purpose, a radical catalyst which forms a radical on heating to perform the heat polymerization may be added to the composition. The radical catalysts are those used generally in the radical polymerization. Numerous radical catalysts have been known in the art. They include, for example, benzoyl peroxide, lauroyl peroxide, tert-butyl hydroperoxide, acetylcyclohexane sulfonyl peroxide, isobutyroyl peroxide, di(2-ethylhexyl)peroxydicarboxylate, diisopropyl peroxydicarboxylate, tert-butyl peroxypivalate, decanoyl peroxide and azobis(2-methylpropionitrile).

They may be used either alone or in the form of a mixture of two or more of them. They are used in an amount of 0.05 to 5 wt. %, preferably 0.1 to 3 wt. %. If necessary, an inorganic filler may be added to the composition.

The inorganic fillers include, for example, powdered quartz glass, powdered crystalline silica, glass fiber, talc, powdered alumina, powdered calcium silicate, powdered calcium carbonate, powdered barium sulfate and powdered magnesia. Among them, the powdered quartz glass and powdered crystalline silica are most preferred. The amount of the inorganic filler which varies depending on the use, the resin components [(a)+(b)+(c)] and kind of the inorganic filler is generally about 50 to 400 parts by weight per 100 parts by weight of the resin components.

The hardening composition of the present invention may contain, if necessary, suitable amounts of a releasing agent such as natural wax, synthetic wax, metal salt of straight-chain fatty acid, acid amide, ester or paraffin; flame retardant such as chlorinated paraffin, bromotoluene, hexabromobenzene or antimony trioxide, a colorant such as carbon black; and a silane coupling agent.

The composition according to the present invention for use as the molding material may be prepared easily by an ordinary process wherein the starting materials in amounts of a given proportion are mixed thoroughly by means of, for example, a mixer and then the mixture is further mixed by means of a roll or kneader.

The composition according to the invention may further comprise (d) a phosphate ester compound of the formula (III) or (IV) or (e) an epoxy compound of the formula (V):

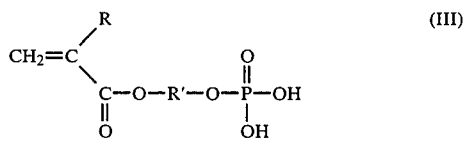

(III)

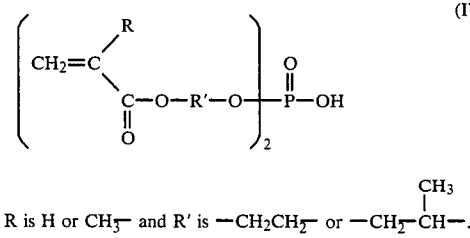

(IV)

wherein R is H or $CH_3$— and R' is —$CH_2CH_2$— or —$CH_2$-$\overset{CH_3}{\underset{|}{CH}}$—.

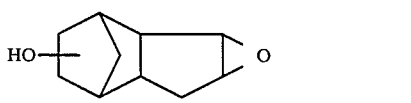

(V)

Examples of the phosphate ester compounds of the formulas (III) and (IV) suitable for in the present invention include methacryloxyethyl phosphate, bismethacryloxyethyl phosphate, acryloxypropyl phosphate, and bisacryloxypropyl phosphate.

These phosphate ester compounds may be used either alone or a mixture of two or more of them. The phosphate ester compound is used in a quantity of 0.1 to 10% by weight, preferably 0.3 to 3% by weight, based on the total weight of the components (a) and (b).

The epoxy compound of the formula (V) used in the present invention can be obtained by epoxidizing hydroxydicyclopentadiene

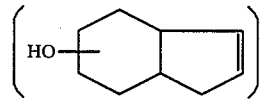

with an epoxidizing agent such as hydrogen peroxide or an organic peracid, said hydroxydicyclopentadiene being obtained by reacting dicyclopentadiene with water.

The epoxy compound is used in a quantity of 5 to 50% by weight, preferably 10 to 30% by weight based on the combined quantity of the components (a) and (b).

The resin-sealed electronic devices according to the present invention may be produced easily by sealing the electronic devices with the composition obtained as above. The sealing may be effected by casting, potting, dipping or molding. The easiest method comprises surface coating by dipping.

The most effective hardening method comprises irradiation with U.V. rays or electron rays by means of a high-pressure mercury lamp. When a further crosslinking hardening reaction is required for attaining a high thermal deformation temperature and a high toughness of the hardened product, it is desirable to harden the same by heating. The heating is effected at a temperature of 50° to 200° C., preferably 80° to 150° C.

The electronic devices herein involve common integrated circuits, large-scale integrated circuits, transistors, thyristors, diodes, resistors and capacitors, though they are not particularly limited.

When the hardening composition according to the present invention is used for sealing, coating or insulating semiconductor devices, electronic parts and electric parts, excellent characteristics and reliability can be expected. Namely, the hardened composition of the present invention is an electric insulating material having excellent characteristics and reliability. The electronic devices sealed by means of the hardened composition according to the present invention have excellent characteristics and reliability. Particularly, as compared with those sealed by means of a conventional, hardened bisphenol-type epoxy resin or novolak phenol or cresol-type epoxy resin, the devices sealed by the composition according to the present invention has a far higher thermal deformation temperature and a higher hardness. The latter is free from working error due to the breakage of the semiconductor elements by a cure shrinkage strain, deformation of the hardened product or bubble formation in the hardened product. The products of the present invention have high electrical insulating properties and moisture resistance.

The following example and comparative example are provided to illustrate the present invention, but are not to be construed as limiting the present invention in any way. Parts given below are by weight unless otherwise stated.

SYNTHESIS EXAMPLE 1

3240 parts of acrylic acid, 20 parts of 2-methylimidazole and 20 parts of hydroquinone monomethyl ether were fed in a four-necked flask equipped with a stirrer, a dropping funnel, an air introducing tube, a thermometer and a condenser. While air was introduced into the flask, the temperature was elevated to 100° C. and 6700 parts of 3,4-epoxycyclohexylmethyl(3,4-epoxy)cyclohexanecarboxylate was added dropwise with stirring. The reaction was carried out for 10 hr while keeping the temperature at 100° C.

The resulting unsaturated alicyclic epoxy ester compound was a light yellow, high viscous resinous substance having an acid value of 2.3 KOH mg/g.

EXAMPLE 1

70 parts of the unsaturated alicyclic epoxy ester obtained above was mixed with 30 parts of styrene, 3 parts of 2-hydroxy-2-methylpropiophenone as a photopolymerization initiator and 0.3 part of di-tert-butyl peroxide as a radical catalyst to obtain a hardening liquid composition having a viscosity of 830 cP (at 25° C.).

A capacitor was dipped in the composition to effect the surface coating and then hardened by irradiation with U.V. rays with an 80 W/cm high-pressure mercury lamp at a distance of 6 cm at 30° C. for 50 sec. It was then hardened by heating to 120° C. for 1 h to obtain the capacitor having a uniform surface insulation coating having a thermal deformation temperature of 120° C. and a Shore D hardness of 88 and free of warpage. In an immersion test effected in boiling water for 24 h, no problem was posed.

EXAMPLE 2

The same procedure as in Example 1 was repeated except that 85 parts of the unsaturated fatty acid epoxy ester obtained in Synthesis Example 1 and 15 parts of styrene were used to obtain a hardened composition having a viscosity of 9500 cP (at 25° C.).

A capacitor having a uniform insulating coating having a thermal deformation temperature of 125° C. and a Shore D hardness of 88 and free of warpage was obtained after hardening under the same conditions as above.

Comparative Preparative Example 1

The same procedure as in Synthesis Example 1 was repeated except that the epoxy compound was replaced with 9430 parts of Epikote 828 (a trade name of Yuka Shell Epoxy K.K.; epoxy equivalent of 190) which is an epibis-type epoxy resin prepared from epichlorohydrin and bisphenol A in the same device as in Synthesis Example 1 to obtain an unsaturated epoxy ester having an acid value of 2.1.

Comparative Example 1

70 parts of the unsaturated epoxy ester obtained in Comparative Preparative Example 1 was mixed with 30 parts of styrene, 3 parts of 2-hydroxy-2-methylpropiophenone and 0.3 part of di-tert-butyl peroxide to obtain a composition having a viscosity of 113.7 cP (at 25° C.). A capacitor was dipped therein and the composition was hardened by irradiation with U.V. rays followed by heating at 120° C. for 2 h. The hardened product had only poor physical properties, i.e. a Shore D hardness of 85 and a thermal deformation temperature of 91° C.

Comparative Example 2

100 parts of Epikote 1004 (a product of Yuka Shell Epoxy K.K., having an epoxy equivalent of 910 and a melting point of 97° C.) which is an epibis-type solid epoxy resin prepared from epichlorohydrin and bisphenol A was mixed with 5 parts of dicyandiamide as a hardening agent and 3 parts of 2-methylimidazole. The mixture was melt-blended by means of a roll at 110° C. for 5 min, cooled and pulverized to obtain a powdered epoxy paint. The surface of a capacitor was coated with this powdered paint by fluidization dip coating method and then hardened at 150° C. for 1 h.

The resulting surface insulating coating had a thermal deformation temperature of as low as 80° C. Further, a deformation of the capacitor due to cure shrinkage was observed.

Comparative Example 3

The same procedure as in Comparative Example 2 was repeated except that 10 parts of polypropylene glycol (molecular weight: 3000) was further added thereto to overcome the defect of cure shrinkage. The resulting powdered paint was used for coating the surface of a capacitor by the fluid fluidization dip coating method and then hardened at 150° C. for 1 h.

The product had still a thermal deformation temperature of as low as 70° C. and the hardened coating contained bubbles, though no cure shrinkage was observed.

EXAMPLE 3

30 parts of styrene, 3 parts of 2-hydroxy-2-methylpropiophenone (as a photopolymerization initiator), 0.3 parts of di-tert-butyl peroxide (as a free-radical catalyst) and 0.5 parts of bismethacryloxyethyl phosphate were blended with 70 parts of the unsaturated alicyclic epoxy ester compound obtained in Synthesis Example 1 to obtain a liquid curable composition having a viscosity of 830 cP at 250° C.

A capacitor was immersed in the resulting composition to effect surface coating, and the coated capacitor was irradiated with ultraviolet light at 30° C. and at a distance of 6 cm for 50 sec using a high-pressure mercury vapor lamp to cure the composition. The curing was carried out by heating at 120° C. for one hr to afford a capacitor with a uniform, non-warp surface insulation coating having a Shore D hardness of 88 and a heat distortion temperature of 125° C. An immersion test was made in boiling water for 96 hr, but there was no significant problem.

EXAMPLE 4

The procedure of Example 3 was repeated except that 85 parts of the unsaturated alicyclic epoxy ester compound, 15 parts of styrene and 0.5 parts of acryloxypropyl phosphate were used. A curable composition having a viscosity of 9500 cP at 25° C. was obtained.

The curing was carried out under similar conditions to give a capacitor with a uniform, non-warp surface insulation coating having a Shore D hardness of 88 and a heat distortion temperature of 130° C.

After the capacitor was left to stand at 85° C./95% RH for 1500 hr, percentage change in the capacity of the capacitor was measured and it was found that the change was only 3% or below.

Example 5

30 parts of styrene, 3 parts of 2-hydroxy-2-methylpropiophenone (as a photopolymerization initiator), 0.3 parts of di-tert-butyl peroxide (as a free-radical catalyst) and 30 parts of an epoxy compound of formula (v):

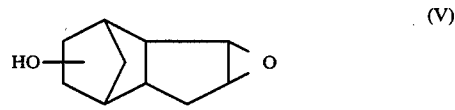

(V)

was blended with 70 parts of the unsaturated alicyclic epoxy ester compound obtained in synthesis Example 1 to obtain a liquid curable composition having a viscosity of 900 cP at 25° C.

A capacitor was immersed in the resulting composition to effect surface coating, and the coated capacitor was irradiated with ultraviolet light at 30° C. and at a distance of 6 cm for 50 sec using a high-pressure mercury vapor lamp to cure the composition. The curing was carried out by heating at 120° C. for one hr, to afford a capacitor with a uniform, non-warp surface insulation coating having a shore D hardness of 88 and a heat distortion temperature of 100° C. An immersion test was made in boiling water for 96 hr, but there was no significant problem, because adhesion was improved.

Comparative Example 4

The procedure of Example 5 was repeated except that 30 parts of the epoxy compound of the formula (I) was omitted. A liquid curable composition having a viscosity of 830 cP at 25° C. was obtained.

The curing was carried out under similar conditions to obtain a capacitor with a non-warp surface insulation coating having a heat distortion temperature of 120° C. An immersion test was conducted in boiling water for 48 hr and lowering in surface insulation resistance was found, because adhesion was poor.

The embodiments of the invention in which an exclusive property or privilege is claimed are defined as follows:

1. A resin-sealed electronic device which is an integrated circuit, transistor, thyristor, diode, resistor or capacitor, coated with a cured resin composition for imparting heat resistance or electrical insulating properties thereto, said resin composition having been prepared by curing, with radiation, a composition comprising
    (a) an unsaturated, radical-polymerizable, alicyclic ester compound prepared by reacting an alicyclic epoxy compound having at least two epoxy groups in the molecule, with from 0.5 to 1.1 equivalents, per equivalent of said epoxy groups, of acrylic or methacrylic acid, under conditions effective to cause ring opening of said epoxy groups and esterification of the carboxyl groups of said acrylic or methacrylic acid to form an alicyclic ester compound and to prevent substantial polymerization of said alicyclic ester compound.
    (b) a radical-polymerizable vinyl monomer having at least one polymerizable vinyl group in the molecule, other than ester (a), and selected from the group consisting of acrylates, methacrylates, styrene, substituted styrenes, n-vinylpyrrolidone, acrylonitrile, vinyl acetate and mixtures thereof, and
    (c) a photopolymerization initiator capable of generating free radicals and initiating polymerization of (a) and (b), upon irradiation with ultraviolet radiation,
    the weight ratio of (a)/(b) being in the range of 40/60 to 95/5.

2. A device as claimed in claim 1, in which said composition contains from 0.1 to 10 wt.%, based on the total weight of (a) plus (b), of an additional phosphate ester compound of the formula (III) or (IV):

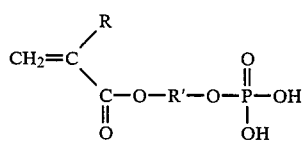

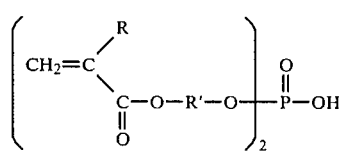

wherein R is H or CH$_3$— and R' is —CH$_2$CH$_2$— or

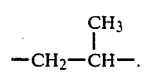

3. A device as claimed in claim 1, in which said composition contains from 5 to 50 wt.%, based on the total weight of (a) plus (b), of an epoxy compound of the formula (V):

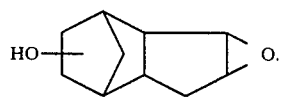

4. A device as claimed in claim 1, wherein said alicyclic epoxy compound is selected from the group consisting of:

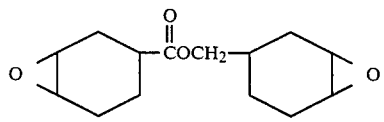

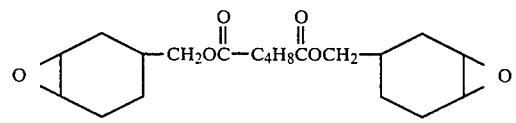

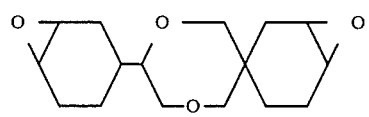

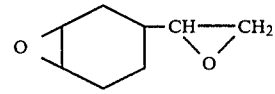

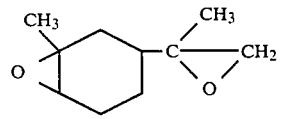

5. A device as claimed in claim 1, in which said vinyl monomer (b) is selected from the group consisting of methyl acrylate, ethyl acrylate, propyl acrylate, n-butyl acrylate, isobutyl acrylate, t-butyl acrylate, amyl acrylate, n-hexyl acrylate, 2-ethylhexyl acrylate, cyclohexyl acrylate, octyl acrylate, nonyl acrylate, dodecyl acrylate, β-hydroxyethyl acrylate, β-hydroxypropyl acrylate, glycerol monoacrylate, polycaprolactonediol monoacrylate, glycidyl acrylate, dimethylaminoethyl acrylate, phenoxyethyl acrylate, cellosolve acrylate, allyl acrylate, benzyl acrylate, isobornyl acrylate, tetrahydrofurfuryl acrylate, ethylene glycol diacrylate, diethylene glycol diacrylate, triethylene glycol diacrylate, 1,4-butylene glycol diacrylate, neopentyl glycol diacrylate, neopentyl glycol adipate diacrylate, neopentyl glycol hydroxypivalate diacrylate, trimethylolpropane triacrylate, pentaerythritol triacrylate, dipentaerythritol hexaacrylate, polyester acrylates, epoxy acrylate, urethane acrylate, novolak acrylate, methacrylates corresponding to the foregoing acrylates, styrene, vinyltoluene, α-methylstyrene, N-vinylpyrrolidone, acrylonitrile and vinyl acetate.

6. A device as claimed in claim 1, in which said initiator is selected from the group consisting of benzoin, benzoic methyl ether, benzoin ethyl ether, benzoin n-propyl ether, benzoin isopropyl ether, benzoin n-butyl ether, benzophenone, p-methylbenzophenone, Michler's ketone, acetophenone, 2-chlorodioxanthone, anthraquinone, 2-methylanthraquinone, phenyl disulfide and 2-nitrofluorene.

7. A device as claimed in claim 1, in which said composition is free of a cross-linking agent for said epoxy compound.

8. A method of sealing an electronic device which is an integrated circuit, transistor, thyristor, diode, resistor or capacitor, with a heat resistant or electrical insulating resin, which comprises coating said electronic device with a composition comprising
   (a) an unsaturated, radical-polymerizable, alicyclic ester compound prepared by reacting an alicyclic epoxy compound having at least two epoxy groups in the molecule, with from 0.5 to 1.1 equivalents, per equivalent of said epoxy groups, of acrylic or methacrylic acid, under conditions effective to cause ring opening of said epoxy groups and esterification of the carboxyl groups of said acrylic or methacrylic acid to form said alicyclic ester compound and to prevent substantial polymerization of said alicyclic ester compound,
   (b) a radical-polymerizable vinyl monomer having at least one polymerizable vinyl group in the molecule, other than ester (a), and selected from the group consisting of acrylates, methacrylates, styrene, substituted styrenes, n-vinylpyrrolidone, acrylonitrile, vinyl acetate and mixtures thereof, and
   (c) a photopolymerization initiator capable of generating free radicals and initiating polymerization of (a) and (b), upon irradiation with ultraviolet radiation,
   the weight ratio of (a)/(b) being in the range of 40/60 to 95/5.
   then irradiating the coated electrical circuit member with radiation effective to cure the coating by polymerizing (a) and (b).

9. A method as claimed in claim 8, including the step of heating the cured coating at a temperature of from 50° to 200° C.

10. A device as claimed in claim 1 in which said device is an integrated circuit.

11. A device as claimed in claim 1 in which said device is a transistor.

12. A device as claimed in claim 1 in which said device is a thyristor.

13. A device as claimed in claim 1 in which said device is a diode.

14. A device as claimed in claim 1 in which said device is a resistor.

15. A device as claimed in claim 1 in which said device is a capacitor.

16. A device as claimed in claim 1 in which said composition consists of (a), (b) and (c).

17. A device as claimed in claim 2 in which said composition consists of (a), (b), (c) and said phosphate ester compound.

18. A device as claimed in claim 3 in which said composition consists of (a), (b), (c) and said epoxy compound.

* * * * *

UNITED STATES PATENT AND TRADEMARK OFFICE
CERTIFICATE OF CORRECTION

PATENT NO. : 4 703 338
DATED : October 27, 1987
INVENTOR(S) : Yosuke SAGAMI et al It is certified that error appears in the above-identified patent and that said Letters Patent is hereby corrected as shown below:

Column 11, line 40; change "an" to ---said---.
           line 42; after "compound" change the period to a comma.
Column 13, line 12; change "benzoic" to ---benzoin---.
Column 14, line 11; after "95/5" change the period to a comma.

Signed and Sealed this

Fifth Day of April, 1988

Attest:

DONALD J. QUIGG

Attesting Officer      Commissioner of Patents and Trademarks